US008468470B2

(12) United States Patent
Hsu et al.

(10) Patent No.: US 8,468,470 B2
(45) Date of Patent: Jun. 18, 2013

(54) MULTI-PATTERNING METHOD

(75) Inventors: Chin-Chang Hsu, Banqiao (TW);
Wen-Ju Yang, Hsinchu (TW);
Hsiao-Shu Chao, Baoshan Township, Hsinchu County (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/238,127

(22) Filed: Sep. 21, 2011

(65) Prior Publication Data

US 2013/0074018 A1    Mar. 21, 2013

(51) Int. Cl.
*G06F 17/50*    (2006.01)

(52) U.S. Cl.
USPC .............................................. 716/54; 716/55

(58) Field of Classification Search
USPC ....................................... 716/54, 55
See application file for complete search history.

(56) References Cited

U.S. PATENT DOCUMENTS

| 7,531,449 | B2 | 5/2009 | Park et al. |
| 7,879,727 | B2 | 2/2011 | Postnikov et al. |
| 7,906,253 | B2 | 3/2011 | Aton et al. |
| 2007/0212648 | A1* | 9/2007 | Lalbahadoersing et al. .. 430/311 |
| 2008/0037861 | A1* | 2/2008 | Nikolsky ...................... 382/149 |
| 2008/0244504 | A1* | 10/2008 | Drapeau et al. ................. 716/20 |
| 2009/0068843 | A1 | 3/2009 | Yang |
| 2009/0087619 | A1 | 4/2009 | Aton et al. |
| 2009/0125866 | A1 | 5/2009 | Wang et al. |
| 2010/0176479 | A1 | 7/2010 | Postnikov et al. |
| 2010/0187658 | A1* | 7/2010 | Wei ................................ 257/618 |
| 2011/0023002 | A1 | 1/2011 | Cheng et al. |
| 2011/0193234 | A1* | 8/2011 | Chen et al. ..................... 257/773 |
| 2012/0196230 | A1* | 8/2012 | Cho et al. ....................... 430/319 |

OTHER PUBLICATIONS

"Tachyon™ DDL & Tachyon™ DPT, A Comprehensive Low-K1 Computational Lithography Solution", Brion Technologies, Inc., 2008, 4 pages.
M. Cho et al., Double Patterning Technology Friendly Detailed Routing, IEEE/ACM International Conference on Computer-Aided Design, pp. 506-511, Nov. 2008.
R. Kruif et al., Wafer Based Mask Characterization for Double Patterning Lithography, 24th European Mask and Lithography Conference, pp. 71-82, Jan. 2008.

(Continued)

*Primary Examiner* — Stacy Whitmore
*Assistant Examiner* — Magid Dimyan
(74) *Attorney, Agent, or Firm* — Duane Morris LLP; Steven E. Koffs

(57) ABSTRACT

A method comprises (a) receiving data representing a layout of a DPT-layer of an integrated circuit generated by a place and route tool, the layout including a plurality of polygons to be formed in the DPT-layer by a multi-patterning process; (b) receiving at least one identification of a subset of the plurality of polygons that are to be formed in the DPT-layer using the same photomask as each other; (c) constructing a graph of the subset of the plurality of polygons and any intervening polygons of the plurality of polygons, where the subset of the plurality of polygons are represented in the graph by a single node, the graph including connections connecting adjacent ones of the polygons in the graph that are positioned within a threshold distance of each other; and (d) identifying a multi-patterning conflict if any subset of the connections form an odd loop.

22 Claims, 9 Drawing Sheets

OTHER PUBLICATIONS

K. Bubke et al., Mask Characterization for Double Patterning Lithography, Journal of Micro/Nanolithography, MEMS and MOEMS, 10 pages, Jan. 2009.

Mitra et al., Radar: RET-Aware Detailed Routing Using Fast Lithography Simulations, Proceedings of the 42nd Design Automation Conference, pp. 369-372, Jun. 2005.

* cited by examiner

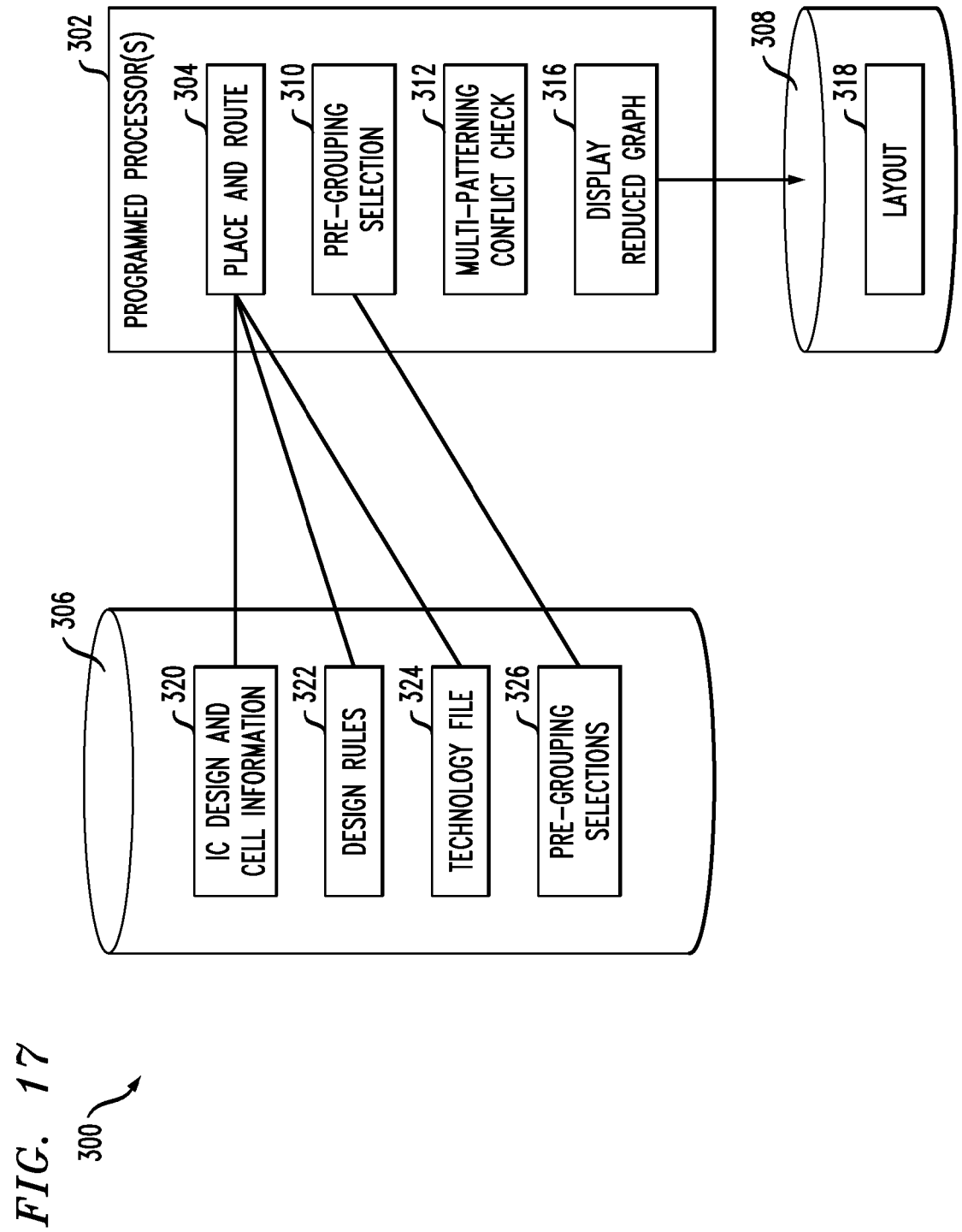

MULTI-PATTERNING METHOD

FIELD

The present disclosure relates to semiconductor fabrication generally and more specifically to multi-patterning, such as double patterning.

BACKGROUND

In semiconductor fabrication processes, the resolution of a photoresist pattern begins to blur at about 45 nanometer (nm) half pitch. To continue to use fabrication equipment purchased for larger technology nodes, double exposure methods have been developed.

Double exposure involves forming patterns on a single layer of a substrate using two different masks in succession. As a result, a minimum line spacing in the combined pattern can be reduced while maintaining good resolution. In a method referred to as double dipole lithography (DDL), the patterns to be formed on the layer are decomposed and formed on a first mask having only horizontal lines, and on a second mask having only vertical lines. The first and second masks are said to have 1-dimensional (1-D) patterns, which can be printed with existing lithographic tools.

Another form of double exposure is referred to as double patterning technology (DPT). Unlike the 1-D approach of DDL, DPT in some cases allows a vertex (angle) to be formed of a vertical segment and a horizontal segment on the same mask. Thus, DPT generally allows for greater reduction in overall IC layout than DDL does. DPT is a layout splitting method analogous to a two coloring problem for layout splitting in graph theory. The layout polygon and critical space are similar to the vertex and edge of the graph respectively. Two adjacent vertices connected with an edge should be assigned different colors. If only two masks are to be used, then only two "color types" are assigned. Each pattern on the layer is assigned a first or second "color"; the patterns of the first color are formed by a first mask, and the patterns of the second color are formed by a second mask. A graph is 2-colorable only if it contains no odd-loop.

In terms of graph theory, when the total number of relationships between patterns that violate the minimum threshold spacing for a single mask (referred to as the separator distance) is odd, an odd loop is present, and DPT cannot be used without changing the layout.

If two features are so close that a high resolution exposure cannot be obtained by DDL or DPT decomposition, the pattern is said to have a "native conflict". Such a problem can be addressed by changing the layer design.

Improved methods for double patterning design flow are desired.

BRIEF DESCRIPTION OF THE DRAWINGS

FIG. 17 is a block diagram of a system for performing the multi-patterning conflict checks.

DETAILED DESCRIPTION

Figure 2:
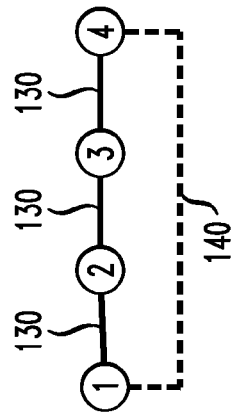
FIG. 2 is a graph of the patterns in the metal layer of FIG. 1.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Designers and/or foundry personnel (collectively referred to below as a "user") may find it desirable to pre-designate one or more groups of patterns (referred to collectively as polygons) on a metal layer, such that the patterns within a given group are all formed by the same photomask. In some embodiments, this pre-grouping does not limit the groups to specific mask assignments, but ensures that a group of patterns are all assigned to the one mask. For example, following the completion of the place and route steps using an electronic design automation (EDA) tool, the user views the layout on a display of a computer system, and applies markers to select polygons which the user wants formed by the same mask. These selections are fed into the multi-patterning decomposition tool, which assigns all of the polygons in the metal layer to one of two photomasks for patterning the metal layer. For example, the marked polygons can be assigned first, based on the user's pre-grouping information. The remaining polygons can be assigned to either photomask, so long as no multi-patterning conflicts (violations of minimum distance thresholds for either mask) result.

In some cases, the user may use this capability to try to group together patterns which would cause a multi-patterning conflict if assigned to the same mask, given the current layout. To maximize multi-patterning design freedom, a method is described below enabling checking for pre-grouping design layout. This method quickly identifies multi-patterning conflicts due to the user's pre-grouping of patterns and notifies the user. The user can modify the design (e.g., increase the spacing between two or more of the polygons, or re-route the path connecting two nodes, or making the odd loop to be even by removing or adding one polygon. For example, the process can remove one polygon and modify an upper layer to achieve the same function.) to eliminate the conflict, allowing the user to proceed with the user's selected pre-grouping.

In the examples below, reference is made to two-mask (double-patterning) techniques. These are only by way of example, and the concepts may be extended to systems employing more than two photomasks per DPT-layer. Thus, as used herein, the term DPT-layer refers to any multi-patterned layer patterned using two or more photomasks. Also, the method is not limited to multi-patterned metal layers. For example, active layers, inter-connect and metal layers can all be processed as DPT-layers. This method may be used for any or all types of double-patterning layers.

Figure 1:
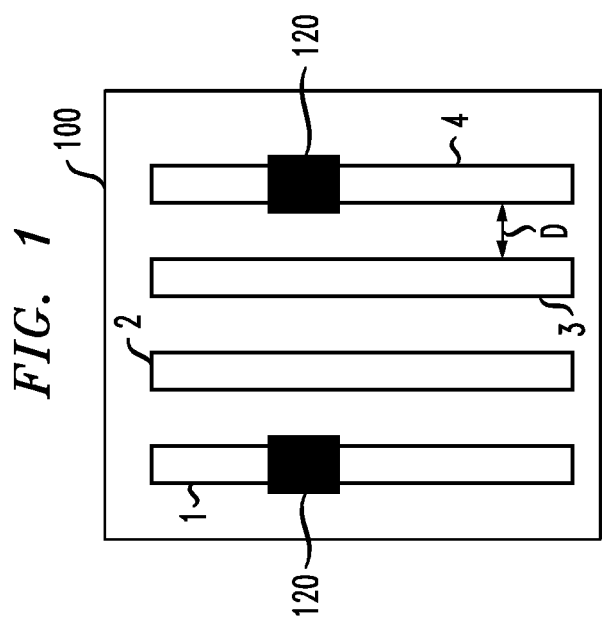
FIG. 1 is a diagram of a metal layer having patterns marked to be pre-grouped for double patterning.

FIG. 1 is a simplified diagram of a metal layer 100 having a plurality of polygons 1, 2, 3 and 4. The polygons 1, 2, 3 and 4 may be lines or more complex shapes (such as those shown in FIG. 7). In the example of FIG. 1, the user selects polygons 1 and 4. In some embodiments, the user applies markers 120 to the selected polygons using the graphical user interface of a computer program, which allows the user to select one or more polygons and one or more group identifiers. The group identifier may be a color, for example. By assigning the same colored marker 120 to polygons 1 and 4, the user directs the double-patterning decomposition process to assign both of these patterns to the same mask.

Assuming that the distance D between each pair of adjacent polygons is less than the threshold minimum separator distance (G0) for forming patterns using a single mask, the multi-patterning decomposition attempts to divide the patterns between two masks, so that the distance between adjacent patterns on each individual mask is greater than the G0 distance. The G0 space is derived from the wafer experiments. Polygons with space less than G0 distance will not be processed well, and cause small process window and induce scum. Different DPT-layers have different value of G0 distance. Also, different pattern type within the same layer have different G0 distances as well. For example, in a 20 nm generation metal layer the G0 distance is about 100 nm for line-end pattern distance and 80 nm for line-edge-side pattern distance. In the example of FIG. 1, given that polygons 1 and 4 are to be located on a first mask, the polygons 2 and 3 cannot be assigned to the first and second masks in any combination that does not result in a double-patterning conflict. If polygon 2 is assigned to the first mask, then there is a conflict due to the distance between polygons 1 and 2 being less than the threshold minimum separator distance (G0). If polygon 3 is assigned to the first mask, then there is a conflict due to the distance between polygons 3 and 4 being less than the threshold minimum separator distance (G0). If polygons 2 and 3 are both assigned to the second mask, then there is a conflict due to the distance between polygons 2 and 3 being less than the threshold minimum separator distance (G0). Thus, in this example, to achieve the desired pre-grouping of patterns 1 and 4, the user will need to change the layout (e.g., increase the distance between at least two of the polygons, or reroute one of the paths, or making the odd loop to be even by removing or adding one polygon.). The user can then produce a conflict free layout, and proceed to fabrication of photomasks using the modified layout.

Other configurations of polygons are more complex than that shown in FIG. 1, so that an individual evaluation of each possible assignment to check the pre-grouping selections would be time consuming. A method is described below to more quickly identify the presence of a multi-patterning conflict due to pre-grouping.

The inventors have determined a method for detecting conflicts when pre-grouping polygons for assignment to the same mask as other polygons in the same group.

FIG. 2 shows a graph representing the polygons 1-4 of FIG. 1. Each pair of polygons separated by a distance less than the threshold minimum separator distance G0 is connected by a G0 connection 130. Each pair of pre-grouped polygons is connected by a virtual connection 140.

Figure 3:
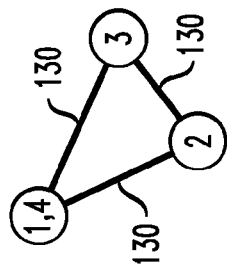
FIG. 3 is a reduced graph based on the graph of FIG. 2.

FIG. 3 shows a reduced graph based on the graph of FIG. 2. As shown in FIG. 3, for each virtual connection 140, the virtually connected pair of polygons 1 and 4 is replaced by a single node 1,4. In this example, the result is a triangle having polygons 1,4-2-3.

Once the reduced graph of FIG. 3 is formed, each closed loop within the reduced graph is checked to determine whether it has an odd or even number of sides (where each side of the loop represents a space between polygons that is less than the G0 distance). If the number of sides is odd (an odd-cycle loop), then there is a conflict. In the example of FIG. 3, there is are three sides in the loop (an odd number), so there is a conflict.

In terms of graph theory, since the pre-grouped polygons are assigned the same color as each other, then there is a conflict if an odd loop is present (a closed loop having an odd number of connections 130). Conversely, for the pre-grouped (same color) polygons, there is no conflict if there is an even loop or no loop at all.

As an illustration, a set of five consecutive polygons (D<G0) with the first and fifth polygons pre-grouped (not shown) is an example of an even loop, which does not cause a multi-patterning conflict. The reduced graph of the five polygons would be a quadrilateral.

A set of four consecutive polygons (D<G0) with the first and third polygons pre-grouped is an example in which the reduced graph has no loop, and in which there is no multi-patterning conflict. The reduced graph would be an angle having two sides and a vertex.

Figure 4:
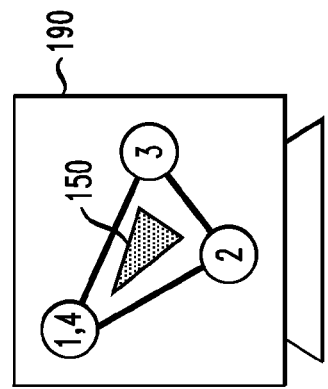
FIG. 4 shows an automated display providing an indication of an odd loop conflict in the graph of FIG. 3.

FIG. 4 shows a display device 190 outputting an identification 150 of a conflict based on the user's pre-grouping. Once the conflict is identified, the user can eliminate the conflict and keep the pre-grouping of polygons 1 and 4, by increasing the distance D between any of the pairs of adjacent polygons 1-4 to a distance greater than G0, which eliminates one of the connections 130 in FIG. 3. (The connection 130 is eliminated, because a connection 130 represents a spacing between polygons less than the threshold minimum separation distance G0). Alternatively, a path between two nodes of the metal layer can be re-routed. In another embodiment, the odd loop is changed to an even loop by removing or adding an odd number (1, 3, 5, etc.) of polygons.

Figure 5:
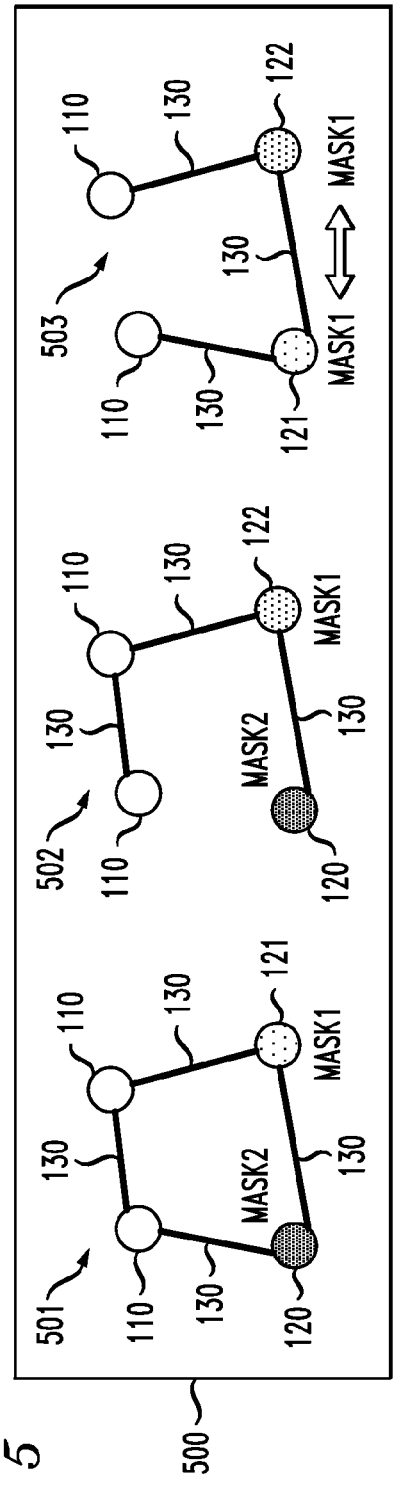
FIG. 5 show individual graphs of three sets of patterns on a metal layer to be pre-grouped with three different group markers.
Figure 6:
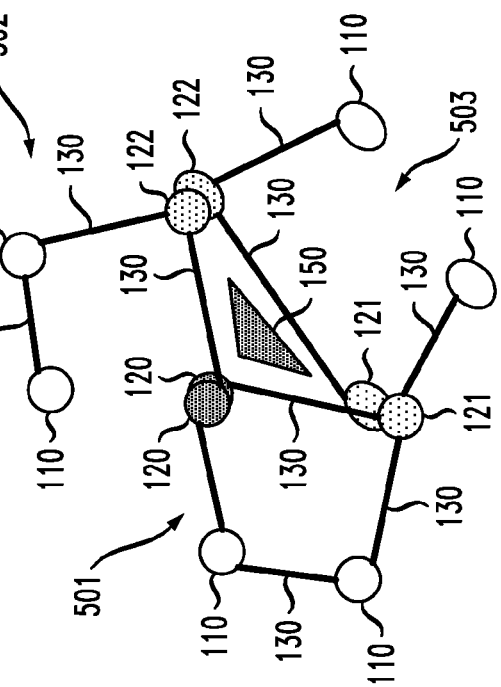
FIG. 6 is a combined graph based on the graphs of FIGS. 5A-5C.

FIGS. 5 and 6 show a more complex example, in which the user selects three pre-grouping sets, to be used in two masks to form a metal layer 500. In FIG. 5, unmarked (non-selected) polygons are all represented by nodes 110. Although the nodes 110 are all identified by the same reference numeral, they may be shaped differently from each other. The common reference numeral only indicates that they are not selected for pre-grouping. In this example, the user applies three different markers 120, 121, 122 to three respective groups of polygons. As shown in FIG. 5, the user selects the polygons 120 to be pre-grouped on one of the two masks, the polygons 121 to be pre-grouped on one of the two masks, and the polygons 122 to be pre-grouped on one of the two masks. It is noted that there are three groupings, but there are still only two colors (two masks).

In the example of FIG. 5, the polygons are physically arranged in three regions 501, 502 and 503 of the metal layer 500. As shown in the left region 501 in FIG. 5, there is a sub-G0 connection 130 between polygons 120 and 121, so that if polygon 120 is on the second mask, polygon 121 would have to be on the first mask. As shown in the center region 502, there is a sub-G0 connection 130 between polygons 120 and 122, so that if polygon 120 is on the second mask, polygon 122 would have to be on the first mask. As shown in the right region 503, there is a sub-G0 connection 130 between polygons 121 and 122, so that if polygon 122 is on the first mask, polygon 121 would have to be on the second mask. Thus, an exhaustive review of each possible combination would indicate that this set of pre-groupings would cause a conflict.

FIG. 6 shows a graphical solution to identify the conflict without exhaustively reviewing every combination of assignments. All of the polygons in FIG. 5 are merged into a single graph in FIG. 6.

For each pre-grouping, the polygons having the marker associated with that individual group are replaced by a single node in a reduced graph, as shown in FIG. 6. In FIG. 6, the polygons having markers 120 are both visible for ease of illustration, but it will be understood that in the actual graph, they are superimposed in a single node of the graph. Similarly, the polygons having markers 121 are represented by a single node in the graph, and the polygons having markers 122 are represented by a single node in the graph. A comparison of FIGS. 5 and 6 shows that all the nodes 110, 120, 121 and 122 connections 130 in FIG. 5 are also represented in FIG. 6.

As indicated by the conflict symbol 150, the three connections 130 between the nodes 120, 121 and 122 form an odd loop. Thus, the graph of FIG. 6 immediately indicates that a multi-patterning conflict is present.

Figure 7:
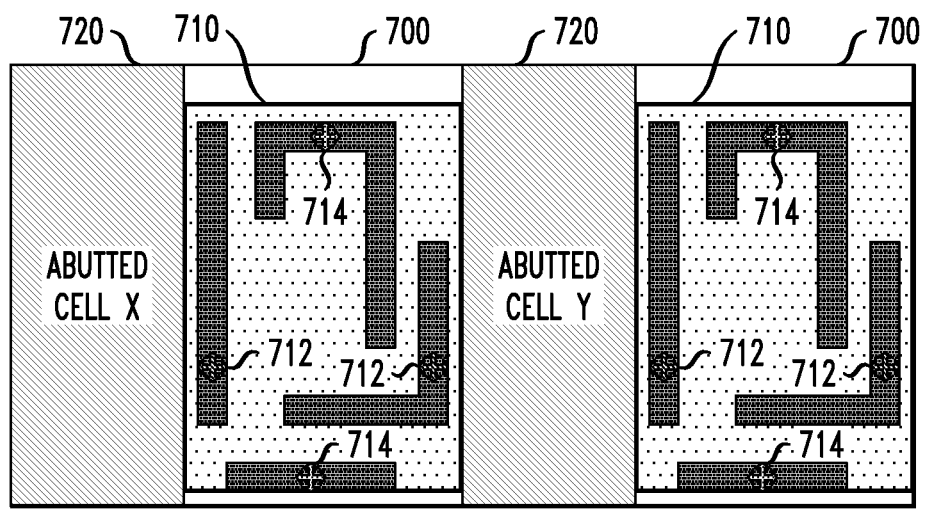
FIGS. 7 and 8 are diagrams of grouping at both the pattern and cell level.
Figure 8:
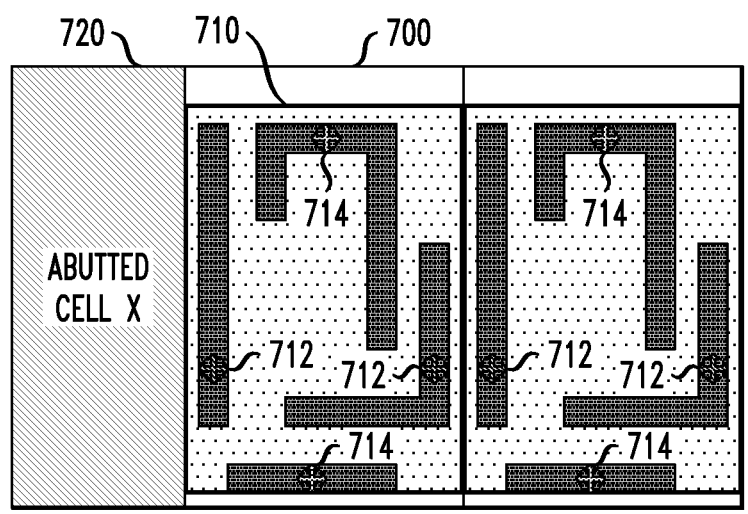

FIGS. 7 and 8 show an example in which polygons may be grouped and marked at the IP library cell level. FIGS. 7 and 8 show a plurality of IP library cells 700, 720 included in a layout. Each cell 700 is a reusable configuration of polygons. Once a cell 700 has been developed and found to be free of double patterning conflicts within the cell, a user can group all the patterns 712, 714 of the entire cell together, so that all patterns of the cell are formed on the same mask. Further, all occurrences of the same cell within a die can also be selected to be formed on the same mask. In FIG. 7, the user applies a cell pre-grouping marker 710 to two instances of the cell 700, so that all the patterns 712, 714 of each cell 700 are formed on the same photomask.

In FIG. 7, the two instances of the cell 700 are separated by some distance, with an intervening cell 720 in between. In FIG. 8, the two instances of the cell 700 are abutting. In some embodiments, both of these cases are treated the same way, and all instances of the cell are to be placed on the same photomask.

In other embodiments, the cases of FIG. 7 and FIG. 8 are handled differently from each other, if the distance between instances of cell 700 in FIG. 7 is greater than a threshold distance. For example, abutting cells 700 with the markers 710 (as shown in FIG. 8) are always grouped onto the same mask, but non-abutting cells 700 (FIG. 7) are only required to be placed on the same mask if the distance between the instances of the cell 700 are less than a threshold distance, or if there are fewer than a threshold number of cells between the instances of the cells 700. Thus, in the case of FIG. 7, if the distance between cells 700 is great enough, the two instances of the cell 700 can be placed on two different masks.

FIGS. 9A, 9B, 10A and 10B show how pre-grouping may be implemented using an extra layer for information related to the virtual connections 140 shown in FIG. 2. The patterns to be pre-grouped are combined with different block layers and marks. In some embodiments, the extra layers and block layers are only used (i.e., input to the tool) to generate connections and identify the group by connection net. That is, the extra layers and block layers do not appear in the final layout for the IC.

Figure 9A:
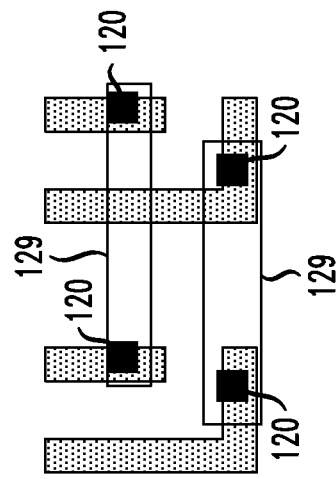
FIGS. 9A and 9B show construction of a connecting pattern on another metal layer.

In FIG. 9A, one type of grouping marker 120 is used on the four patterns. In one embodiment, an additional layer is included in the layout identified to the design rule checking (DRC) tool. Patterns 129 are formed on another layer in the layout, with vias connecting the pre-grouped patterns. The netlist generated by this configuration thus captures the virtual link 140 (of the type shown in FIG. 2), so the pre-grouped polygons can be identified to the DRC tool.

Figure 9B:
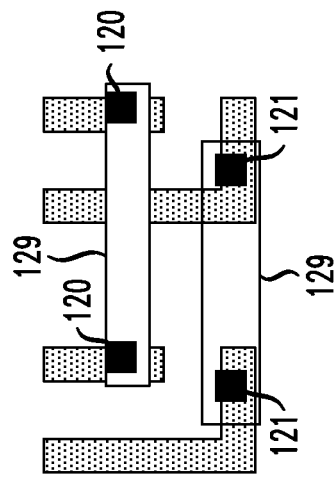

FIG. 9B extends the method of FIG. 9A to include two different types of markers 120, 121. The patterns marked with marker 120 are to be grouped together, and the patterns marked by marker 121 are to be grouped together. As described above with reference to FIG. 9A, patterns 129 are formed on another layer in the layout, with vias connecting the pre-grouped patterns. The netlist generated by this configuration thus captures the virtual link 140.

Figure 10A:
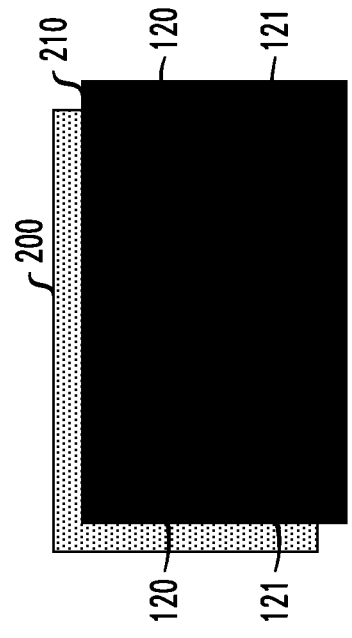
FIGS. 10A and 10B show block layers for connecting the patterns of FIG. 9B.

FIG. 10A shows an embodiment in which two block layers 200 and 210 are implemented. The patterns marked by the markers 120 are connected by vias to a first block layer 200, and the patterns marked by the markers 121 are connected by vias to a second block layer. The netlist generated by this configuration thus captures the virtual links 140.

FIG. 10A shows an embodiment in which two block layers 200 and 210 are implemented. The patterns marked by the markers 120 are connected by vias to a first block layer 200, and the patterns marked by the markers 121 are connected by vias to a second block layer. The netlist generated by this configuration thus captures the virtual links 140.

Figure 10B:
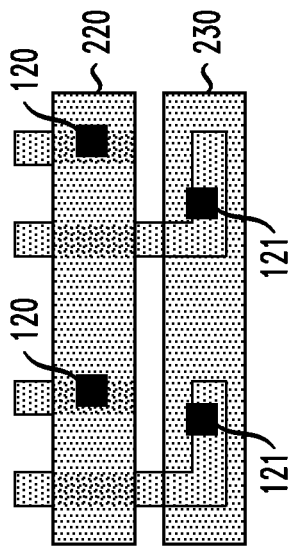

FIG. 10B shows a similar configuration to that of FIG. 9B, except that the connecting patterns 220 and 230 are placed in two different layers.

Figure 11:
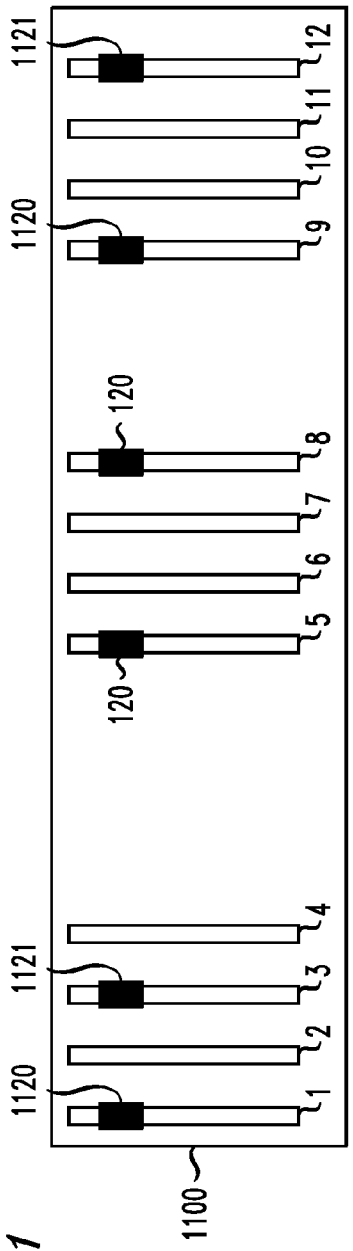
FIG. 11 shows a metal layer having markers for patterns to be pre-grouped for one mask, and markers for restricting patterns to different masks from each other.
Figure 12A:
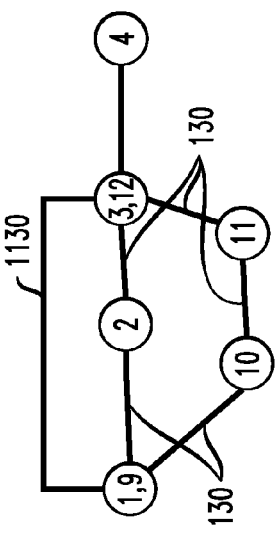
FIGS. 12A and 12B show a graph of the patterns in FIG. 11.
Figure 12B:
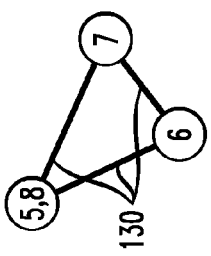
Figure 13:
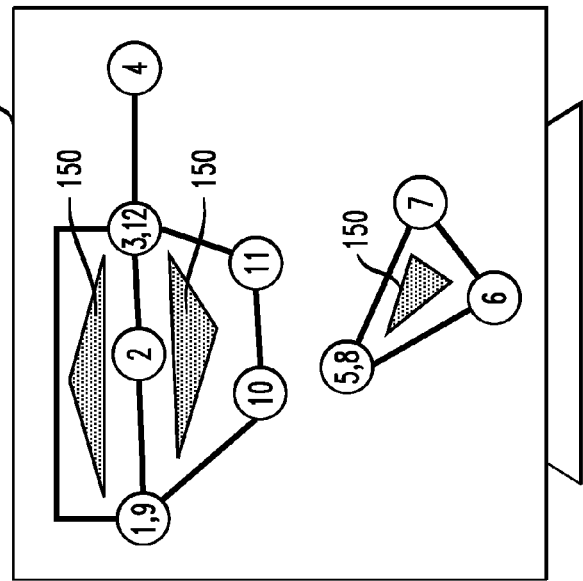
FIG. 13 shows a display for automatically displaying a notification of an odd loop conflict in the graphs of FIGS. 12A and 12B.

FIGS. 11-13 show another embodiment of the multi-patterning conflict checking method. In FIGS. 11-13, the user is provided with the capability to pre-group polygons using a marker 120, to be placed in the same mask as each other. An additional type of marker 1120, 1121 is available to the user. The user can use markers 1120 and 1121 to designate polygons that must be placed on separate masks from each other. In the example of layout 1100, patterns 5 and 8 have the marker 120, indicating they are both to be put on mask 1, or both to be put on mask 2. Polygons 1 and 9 have the marker 1120 and polygons 3 and 12 have the marker 1121. Thus, polygons 1 and 9 must be placed on a different mask than polygons 3 and 12 (but any of these polygons 1, 3, 9, 12 may or may not be on the same mask as polygons 5 and 8.

FIGS. 12A and 12B show a graphical method for identifying whether the layout 1100 has a double patterning conflict. In this example, the distance between the following pairs of adjacent patterns is less than the minimum separator (G0) distance: 1-2, 2-3, 3-4, 5-6, 6-7, 7-8, 9-10, 10-11, and 11-12. Conversely, the distances between all other pairs of polygons (e.g., 4-5, 8-9, 12-1, 1-3) is greater than the G0 distance.

As in the embodiment of FIGS. 1-4, polygons which are pre-grouped are combined into a single node in the graph. Thus, polygons 1 and 9 (having the marker 1120) are represented by a single node 1,9, and polygons 3 and 12 (having the marker 1121) are represented by a single node 3,12. Based on the sub-G0 distance links, FIG. 12A shows the graph connections 130 between the following pairs of polygons: 1,9-2, 1,9-10, 2-3,12, 3,12-4, 3,12-11 and 10-11. As shown in FIG. 12B, pre-grouped polygons 5 and 8 are represented by a single node 5,8, and the graph includes 5,8-6, 5,8-7 and 6-7. The separation of the graphs between FIGS. 12A and 12B indicates that none of the polygons 5, 6, 7 or 8 is separated from the rest of the polygons 1-4, or 9-12 by less than the minimum separator distance G0.

Due to the additional constraint that the user has indicated the polygons 1 and 9 must be on a separate mask from polygons 3 and 12, another virtual link 1130 is added to the graph of FIG. 12A, connecting node 1,9 to node 3,12. In order to determine whether there is a conflict, the user checks to see whether there is an odd loop in either FIG. 12A or FIG. 12B.

In this particular example, as indicated by the three conflict notifications 150 in FIG. 13, there are three odd loops. This indicates that there are currently at least three minimum separation conflicts. In other cases where there is a multi-patterning conflict, there will only be one odd loop.

Figure 14:
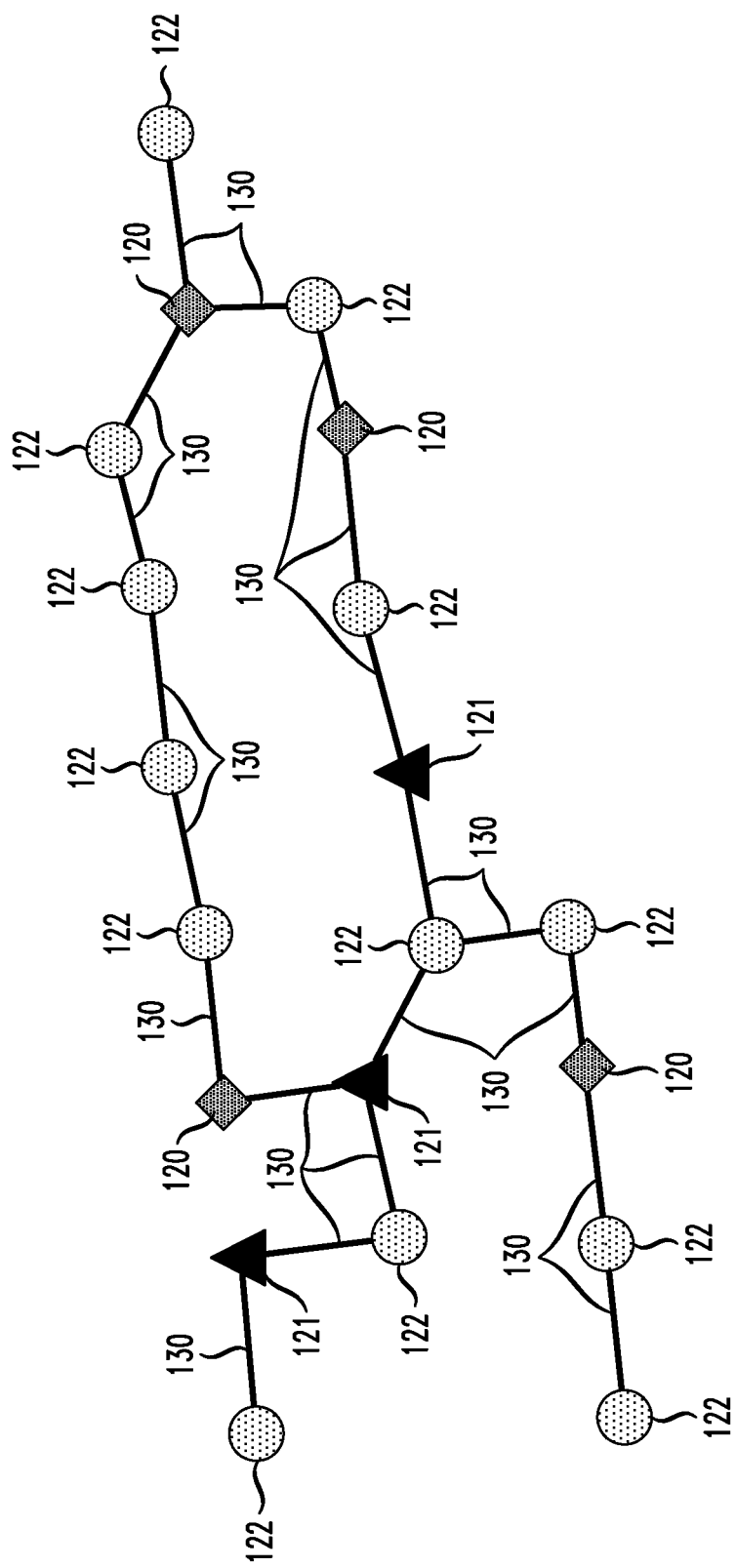
FIG. 14 shows a graph of a metal layer having pre-grouping markers with different priorities.

FIG. 14 shows another example of a graph, in which the user's pre-groupings can be prioritized. In this example, the high priority pre-grouping is shown by diamond markers 120. The medium priority pre-grouping markers are indicated by triangles 121. The lowest priority pre-grouping is indicated by circles 122. The prioritized pre-groupings can be checked in a variety of ways.

In one embodiment, the pre-grouped polygons are checked in up to three different ways for conflicts. First, the layout is checked for conflicts while only considering the polygons indicated by the highest priority markers 120. If any conflict is identified, then a layout change is required to keep this pre-grouping. If there is no conflict identified when only the highest priority pre-grouping is considered, then the check is repeated, while considering both the highest priority pre-grouping and the medium priority pre-grouping indicated by triangles 121. If any conflict is identified, then a layout change is required to keep this pre-grouping. If there is no conflict identified when the highest priority pre-grouping and the medium priority pre-grouping are considered, then the check is repeated, while considering all pre-groupings, high, medium and low priority.

In another embodiment, the user may perform the checking for the three combinations of priorities (high only; high and medium only; high, medium and low), and drop the low priority pre-grouping or low and medium priority pre-groupings, in order to accomplish the most pre-groupings without making any changes to the layout.

Figure 15:
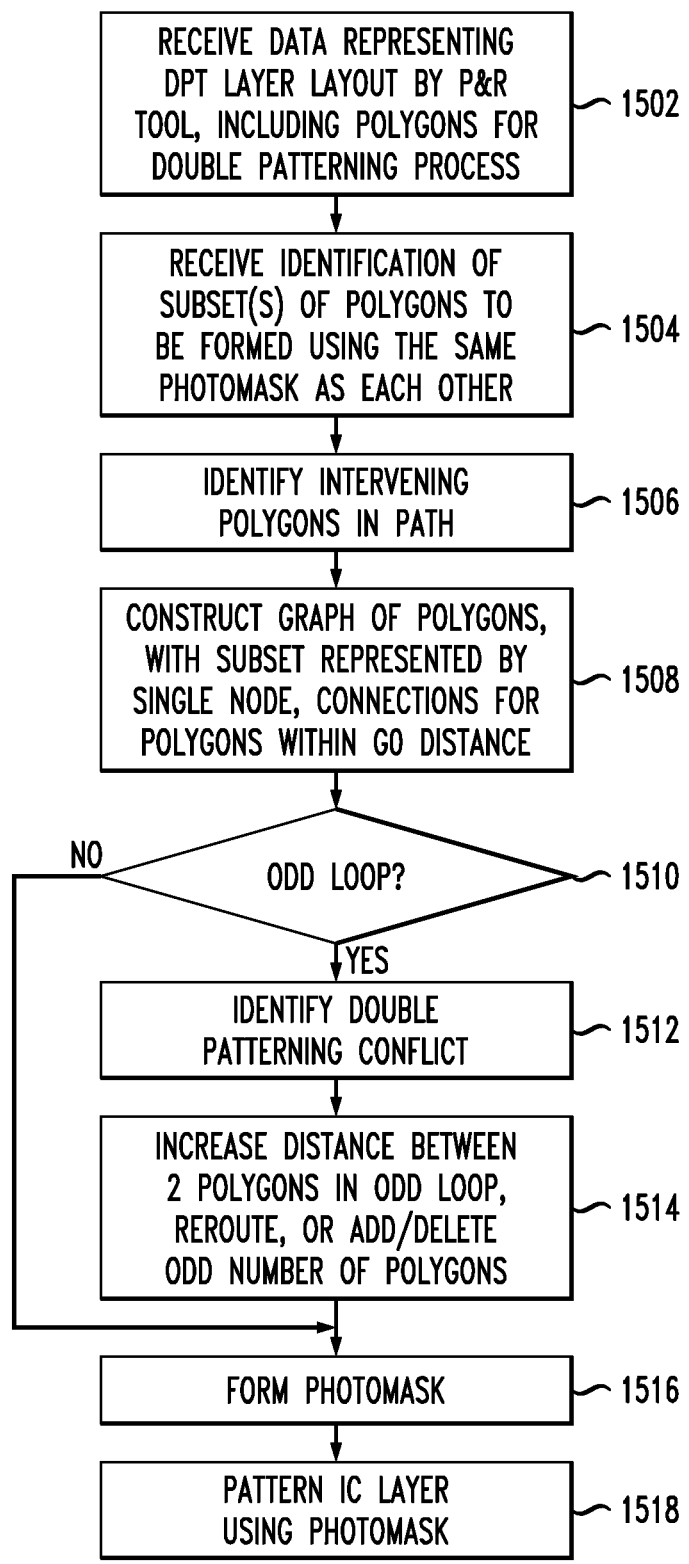
FIG. 15 is a flow chart of a method of checking pre-grouped patterns for double patterning conflicts.

FIG. 15 is a flow chart of a method including the multi-patterning conflict checking. In various embodiments some or all of the computational steps are performed by a computer or other processor.

At step 1502, data are received (by a processor, for example), where the data represent a layout of a DPT-layer (e.g., active layer or metal layer) of an integrated circuit (IC) generated by a place and route tool. The layout includes a plurality of polygons to be formed in the DPT-layer by a multi-patterning process. In some embodiments, the DPT-layer is an interconnect metal layer formed within an inter-metal dielectric layer of the IC.

At step 1504, an identification is received, identifying of one or more subsets of the polygons to be formed using the same photomask as each other. For example, the processor may receive an identification by the user of a selected pre-grouping. The processor may be programmed to display a graph of the layout including the polygons in the DPT-layer, or a portion of the layout. The user is equipped with a palette having one or more markers, or the user can select a marker 120, 121, 122 (FIGS. 1 and 5) from a menu and apply the marker to individual polygons by right-clicking on the polygons or pulling down a menu from a tools menu or application ribbon. The processor receives an identification of two or more polygons for each pre-grouping.

At step 1506, the method identifies any intervening polygons in each path connecting the selected polygons having the same polygon marker.

At step 1508, the method constructs a graph of the subset of the plurality of polygons and any intervening polygons of the plurality of polygons. The subset of the plurality of polygons (that have the same marker 120 and are pre-grouped together) are represented in the graph by a single node. The graph includes connections 130 connecting adjacent ones of the polygons in the graph that are positioned within a threshold distance of each other. The graph includes each subset of the plurality of polygons and any of the plurality of polygons that are; intervening between two of the polygons within the same one of the subsets, and positioned within a threshold distance of each other.

At step 1510, the method checks each closed loop in the graph and determines whether it is an odd loop or an even loop. If the loop has an odd number of sub-G0 connections 130, step 1512 is performed next. If the loop has an even number of sub-G0 connections 130, step 1516 is performed next.

At step 1512, the method identifies a multi-patterning conflict if any subset of the connections form an odd loop. The method outputs a notification of the odd loop. For example, in some embodiments, a marker 150 is displayed on the output display of the computer (as shown FIGS. 4, 6, and 13).

At step 1514, a layout change is made by the designer or foundry, for example. The change may include increasing the distance between two of the polygons in the odd loop. The modified layout is provided from the layout by increasing a distance between two of the plurality of polygons connected by the connections in the odd loop, to a distance greater than the threshold distance. Alternatively, the change may include rerouting a portion of the odd loop, or making the loop an even loop by adding or removing an odd number of polygons.

At step 1516, a photomask is made for patterning the DPT-layer by the multi-patterning process (using a modified layout if steps 1512 and 1514 are performed).

At step 1518, the photomask is subsequently used to pattern a layer of an integrated circuit die.

Figure 16:
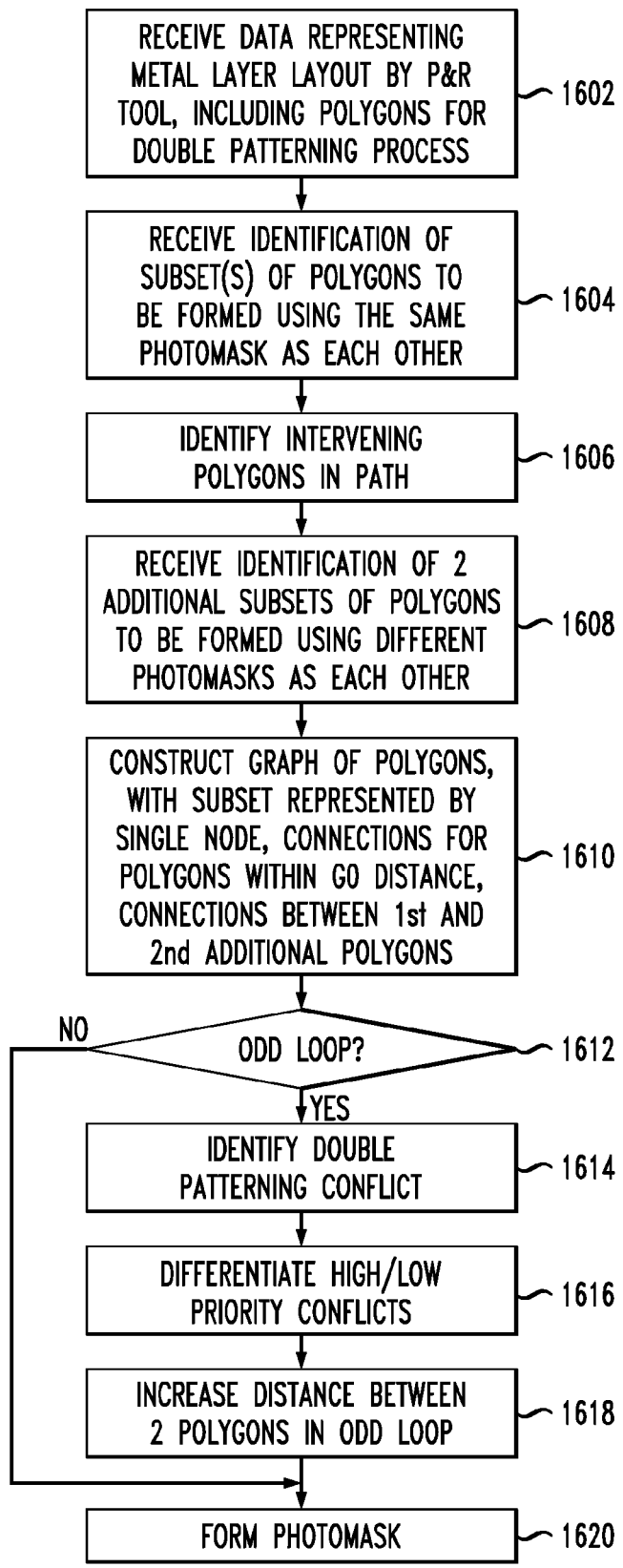
FIG. 16 is a flow chart of a method of checking pre-grouped patterns including IP library cells for multi-patterning conflicts.

FIG. 16 is a flow chart of a another embodiment of the method including multi-patterning conflict checking.

At step 1602 of FIG. 16, data are received (by a processor, for example), where the data represent a layout of a metal layer of an integrated circuit (IC) generated by a place and route tool. The layout includes a plurality of polygons to be formed in the metal layer by a multi-patterning process. In some embodiments, the metal layer is an interconnect layers formed within an inter-metal dielectric layer of the IC.

At step 1604 of FIG. 16, an identification is received, identifying of one or more subsets of the polygons to be formed using the same photomask as each other. For example, the processor may receive an identification by the user of a selected pre-grouping by applying markers 120, 121, 122 (FIGS. 1 and 5) to patterns. Selection may be made using tools similar to those described with reference to step 1504, above.

In some embodiments, the multi-patterning process uses only two photomasks to pattern the metal layer, and step 1604 includes receiving respective identifications of three or more subsets of the plurality of polygons, wherein the polygons within each subset are to be formed in the metal layer using the same photomask as each other polygon in the same subset. That is, the number of pre-groupings may exceed the number of photomasks.

In some embodiments, the layout includes a cell 700 (FIG. 7) from a cell library. The cell has a predetermined configuration of polygons, and the subset of the plurality of polygons includes all of the polygons in the at least one cell. At least two instantiations of the cell are included in the layout. The user may pre-group on a polygon and/or cell basis, so that each instantiation of the cell is to be formed in the metal layer using the same photomask as each other instantiation of the cell. Each instantiation of the cell located within a second threshold distance of another instantiation of the cell is to be formed in the metal layer using the same photomask as each other.

At step 1606, the method identifies any intervening polygons in each path connecting the selected polygons having the same polygon marker.

At step 1608 of FIG. 16, the computer receives from the user two additional subsets of polygons to be formed using different photomasks from each other. The first and second additional subsets of the plurality of polygons are to be formed in the metal layer, such that none of the second additional subset of polygons are to be formed using the same photomask as any of the first additional subset of polygons. As described above with respect to FIG. 11, the user specifies that the group of polygons having the markers 1120 are on a separate mask from the group of polygons having the markers 1121, but either of these groups may be on the same mask with the pre-grouped patterns having the marker 120. Thus, when only two photomasks are used to form the metal layer, at least one polygon of the subset of the plurality of polygons is to be formed using the same photomask as is to be used to form at least one of the first and second additional subsets of polygons. To perform step 1608, the user may be equipped with a palette having two or more markers, or the user can select markers 1120, 1120 (FIG. 11) from a menu and apply the markers 1120, 1121 to individual polygons by right-clicking on the polygons or pulling down a menu from a tools menu or application ribbon.

At step 1610 of FIG. 16, the method constructs a graph of the subset of the plurality of polygons and any intervening polygons of the plurality of polygons. The subset of the plurality of polygons (that have the same marker 120 and are pre-grouped together) are represented in the graph by a single node. The graph includes connections 130 connecting adjacent ones of the polygons in the graph that are positioned within a threshold distance of each other. The graph includes each subset of the plurality of polygons and any of the plurality of polygons that are: intervening between two of the polygons within the same one of the subsets, and positioned within a threshold distance of each other.

Also included in the graph is a respective additional connection between each individual polygon of the first additional subset (indicated by markers 1120) and each individual polygon of the second additional subset (indicated by markers 1121).

At step 1612 of FIG. 16, the method checks each closed loop in the graph and determines whether it is an odd loop or an even loop. If the loop has an odd number of sub-G0 connections 130, step 1614 is performed next. If the loop has an odd number of sub-G0 connections 130, step 1616 is performed next.

At step 1614 of FIG. 16, the method identifies a multi-patterning conflict if any subset of the connections form an odd loop. The method outputs a notification of the odd loop.

For example, in some embodiments, a marker 150 is displayed on the output display of the computer (as shown FIGS. 4, 6, and 13).

At step 1616 of FIG. 16, the method may optionally point out high/medium/low priority conflict if prioritized pre-grouping has been implemented. In some embodiments, conflicts are first pointed out and resolved (by layout change) for higher priority pre-groupings, and then lower priority pre-groupings are checked and resolved.

In other embodiments, the high priority pre-groupings are checked and resolved (by layout change) if present. Medium priority conflicts are checked and the pre-grouping may be incorporated if the conflicts can be resolved only by layout changes with limited-impact (e.g., by increasing the distance between two polygons, but not by entirely rerouting a path). The lowest priority pre-grouping is checked, but only included if there are no conflicts.

At step 1618 of FIG. 16, a layout change is made by the designer or foundry, for example. The change may include increasing the distance between two of the polygons in the odd loop, or rerouting a portion of the odd loop, or adding or removing a polygon. The modified layout is provided from the layout by increasing a distance between two of the plurality of polygons connected by the connections in the odd loop, to a distance greater than the threshold distance.

At step 1620 of FIG. 16, a photomask is made for patterning the metal layer by the multi-patterning process (using a modified layout if steps 1512 and 1514 are performed). The photomask is subsequently used for multi-patterning the layer of the IC.

FIG. 17 is a block diagram of a system for multi-patterning conflict checking, according to one embodiment. Block 302 indicates that one or more programmed processors may be included. In some embodiments, the processing load is performed by two or more application programs, each operating on a separate processor. In other embodiments, the processes are all performed using one processor. Similarly, two media 306 ad 308 are shown, but the data may be stored in any number of media. Although FIG. 17 shows an allocation of the various tasks to specific modules, this is only one example. The various tasks may be assigned to different modules to improve performance, or improve the ease of programming.

System 300 includes an electronic design automation ("EDA") tool 302 such as "IC COMPILER"™, sold by Synopsis, Inc. of Mountain View, Calif., which may include a place and route tool 304, such as "ZROUTE"™, also sold by Synopsis. Other EDA tools 302 may be used, such as the "VIRTUOSO" custom design platform or the Cadence "ENCOUNTER"® digital IC design platform may be used, along with the "VIRTUOSO" chip assembly router 304, all sold by Cadence Design Systems, Inc. of San Jose, Calif.

EDA tool 302 is a special purpose computer formed by retrieving stored program instructions from a non-transient computer readable storage medium 306, 308 and executing the instructions on a general purpose processor (not shown). Examples of non-transient computer readable storage mediums 306, 308 include, but are not limited to, read only memories ("ROMs"), random access memories ("RAMs"), flash memories, or the like. Tangible, non-transient machine readable storage mediums 306, 308 are configured to store data generated by the place and route tool 304.

Router 304 is capable of receiving an identification of a plurality of cells to be included in an integrated circuit ("IC") or interposer layout, including a list 320 of pairs of cells within the plurality of cells to be connected to each other. Router 304 may be equipped with a set of default design rules 322 and tech file 324.

The pre-grouping selection modules 330 display the layout of a metal layer that is to be decomposed into two or more masks for multi-patterning. The module 330 provides the user tools for selecting groups of patterns, such that all polygons within a given group are formed on the same mask as each other for multi-patterning. The module 330 allows the user to mark individual polygons with one type of marker indicating that the marked patterns are to be grouped together on the same mask, with or without any other groupings. The module 330 may optionally allow the user to mark individual polygons with two types of markers indicating that patterns marked by the first marker must be on a separate mask from patterns marked by the second marker. The module may optionally allow the user to prioritize the groupings.

The multi-patterning conflict check module 312 constructs the reduced graph. Based on the place and route program's outputs, and the process of FIG. 17, the path between each pair of polygons selected for pre-grouping is constructed. The relevant distances between adjacent patterns throughout the layout is determined, and the sub-G0 distances are identified. A connection 130 is generated for each sub-G0 distance. A preliminary graph is constructed. Each respective set pre-grouped polygons is replaced by a respective single node. If the pre-grouped sets of polygons must be placed on separate masks, a connection 1130 is generated connecting the respective single node for each such grouping.

The output display module 316 identifies any odd loops in the reduced graph, and outputs the reduced graph with a respective visual identification of each odd loop (i.e., each multi-patterning conflict).

In some embodiments, a method comprises (a) receiving data representing a layout of a metal layer of an integrated circuit generated by a place and route tool, the layout including a plurality of polygons to be formed in the metal layer by a multi-patterning process; (b) receiving at least one identification of a subset of the plurality of polygons that are to be formed in the metal layer using the same photomask as each other; (c) constructing a graph of the subset of the plurality of polygons and any intervening polygons of the plurality of polygons, wherein the subset of the plurality of polygons are represented in the graph by a single node, the graph including connections connecting adjacent ones of the polygons in the graph that are positioned within a threshold distance of each other; and (d) identifying a multi-patterning conflict if any subset of the connections form an odd loop.

In some embodiments, a method comprises: (a) receiving data representing a layout of a metal layer of an integrated circuit generated by a place and route tool, the layout including a plurality of polygons to be formed in the metal layer by a multi-patterning process; (b) receiving at least one identification of a subset of the plurality of polygons that are to be formed in the metal layer using the same photomask as each other; (c) constructing a graph of the subset of the plurality of polygons and any intervening polygons of the plurality of polygons, wherein the subset of the plurality of polygons are represented in the graph by a single node, the graph including connections connecting adjacent ones of the polygons in the graph that are positioned within a threshold distance of each other; (d) identifying a multi-patterning conflict if any subset of the connections form an odd loop; (e) modifying the layout by increasing a distance between two of the plurality of polygons connected by the connections in the odd loop, to a distance greater than the threshold distance or making the odd loop to be even by removing or adding one polygon. For example, the process can remove one polygon and modify the upper layer to achieve the same function; and (f) forming a photomask for patterning the metal layer by the multi-patterning process using the modified layout.

In some embodiments, apparatus comprises a first storage portion of at least one persistent, machine-readable storage medium storing data representing a layout of a metal layer of an integrated circuit generated by a place and route tool. The layout includes a plurality of polygons to be formed in the metal layer by a multi-patterning process. A second storage portion of the at least one persistent, machine-readable storage medium stores data identifying at least one subset of the plurality of polygons that are to be formed in the metal layer using the same photomask as each other. A processor is configured to identify any intervening polygons of the plurality of polygons along a respective path connecting each of pair of polygons within the at least one subset. The processor is configured to construct a graph of the subset of the plurality of polygons and the identified intervening polygons of the plurality of polygons, wherein the subset of the plurality of polygons are represented in the graph by a single node, the graph including connections connecting adjacent ones of the polygons in the graph that are positioned within a threshold distance of each other; and the processor configured to output an identification of a multi-patterning conflict if any subset of the connections form an odd loop.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, when the computer program code is loaded into and executed by a computer, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
    (a) receiving data representing a layout of a double patterned (DPT)-layer of an integrated circuit generated by a place and route tool implemented by a processor, the layout including a plurality of polygons to be formed in the DPT-layer by a multi-patterning process;
    (b) receiving at least one identification of a subset of the plurality of polygons that are to be formed in the DPT-layer using the same photomask as each other;
    (c) constructing a graph of the subset of the plurality of polygons and any intervening polygons of the plurality of polygons, wherein the subset of the plurality of polygons includes at least two polygons unconnected to each other within the DPT layer and having a non-zero unpatterned space therebetween, the at least two polygons represented in the graph by a single node, the graph including connections connecting adjacent ones of the nodes in the graph that are positioned within a threshold distance of each other; and (d) identifying a multi-patterning conflict if any subset of the connections form an odd loop.

2. The method of claim 1, further comprising:
forming a photomask for patterning the DPT-layer by the multi-patterning process using a modified layout, wherein the modified layout is provided from the layout by increasing a distance between two of the plurality of polygons connected by the connections in the odd loop, to a distance greater than the threshold distance.

3. The method of claim 1, wherein the multi-patterning process uses only two photomasks to pattern the DPT-layer, and step (b) includes receiving respective identifications of three or more subsets of the plurality of polygons, wherein the polygons within each subset are to be formed in the DPT-layer using the same photomask as each other polygon in the same subset.

4. The method of claim 3, wherein
the graph includes each subset of the plurality of polygons and any of the plurality of polygons that are:
intervening between two of the polygons within the same one of the subsets, and
positioned within a threshold distance of each other, wherein each subset of the plurality of polygons is represented in the graph by a single node.

5. The method of claim 1, wherein:
the layout includes a cell from a cell library, the cell having a predetermined configuration of polygons, and the subset of the plurality of polygons includes all of the polygons in the at least one cell.

6. The method of claim 5, wherein:
at least two instantiations of the cell are included in the layout, and
each instantiation of the cell located within a second threshold distance of another instantiation of the cell is to be formed in the DPT-layer using the same photomask as each other.

7. The method of claim 5, wherein:
at least two instantiations of the cell are included in the layout, and
each instantiation of the cell is to be formed in the DPT-layer using the same photomask as each other.

8. The method of claim 1, further comprising:
receiving at least one identification of first and second additional subsets of the plurality of polygons that are to be formed in the DPT-layer, such that none of the second additional subset of polygons are to be formed using the same photomask as any of the first additional subset of polygons;
before step (d), including in the graph a respective additional connection between each individual polygon of the first additional subset and each individual polygon of the second additional subset.

9. The method of claim 8, wherein:
at least one polygon of the subset of the plurality of polygons is to be formed using the same photomask as is to be used to form at least one of the first and second additional subsets of polygons.

10. The method of claim 1
wherein the multi-patterning process uses only two photomasks to pattern the DPT-layer, and step (b) includes receiving respective identifications of first and second subsets of the plurality of polygons, the first subset of polygons having a higher priority than the second subset, and
step (d) includes differentiating multi-patterning conflicts among the first set of polygons from multi-patterning conflict among the second set of polygons.

11. The method of claim 1, wherein
step (b) includes:
receiving user inputs comprising at least two more markers applied to the subset of polygons so as to request pre-grouping of the subset of polygons; and
step (c) includes:
forming a virtual connection between the identified subset of polygons that are to be formed in the DPT-layer using the same photomask as each other; and
inputting a block layer to a tool for modeling the virtual connection.

12. A method comprising:
(a) receiving data representing a layout of a double patterned (DPT)-layer of an integrated circuit generated by a place and route tool implemented by a processor, the layout including a plurality of polygons to be formed in the DPT-layer by a multi-patterning process;
(b) receiving at least one identification of a subset of the plurality of polygons that are to be formed in the DPT-layer using the same photomask as each other;
(c) constructing a graph of the subset of the plurality of polygons and any intervening polygons of the plurality of polygons, wherein the subset of the plurality of polygons includes at least two polygons unconnected to each other within the DPT layer and having a non-zero unpatterned space therebetween, the at least two polygons represented in the graph by a single node, the graph including connections connecting adjacent ones of the polygons ion the graph that are positioned within a threshold distance of each other;
(d) identifying a multi-patterning conflict if any subset of the connections form an odd loop and
(e) modifying the layout by one of the group consisting of increasing a distance between two of the plurality of polygons connected by the connections in the odd loop to a distance greater than the threshold distance, re-routing a path formed by the subset of the plurality of polygons and any intervening polygons, adding a polygon to the path, or removing a polygon from the path.

13. The method of claim 12, wherein the multi-patterning process uses only two photomasks to pattern the DPT-layer, and step (b) includes receiving respective identifications of three or more subsets of the plurality of polygons, wherein the polygons within each subset are to be formed in the DPT-layer using the same photomask as each other polygon in the same subset.

14. The method of claim 12, further comprising:
(f) forming the photomask for patterning the DPT-layer by the multi-patterning process using the modified layout.

15. Apparatus comprising:
a first storage portion of at least one persistent, machine-readable storage medium storing data representing a layout of a DPT-layer of an integrated circuit generated by a place and route tool, the layout including a plurality of polygons to be formed in the DPT-layer by a multi-patterning process;
a second storage portion of the at least one persistent, machine-readable storage medium storing data identifying at least one subset of the plurality of polygons that are to be formed in the DPT-layer using the same photomask as each other;

a processor configured to identify any intervening polygons of the plurality of polygons along a respective path connecting each pair of polygons within the at least one subset;

the processor configured to construct a graph of the subset of the plurality of polygons and the identified intervening polygons of the plurality of polygons, wherein the subset of the plurality of polygons includes at least two polygons unconnected to each other within the DPT layer and having a non-zero unpatterned space therebetween, the at least two polygons represented in the graph by a single node, the graph including connections connecting adjacent ones of the polygons in the graph that are positioned within a threshold distance of each other; and the processor configured to output an identification of a multi-patterning conflict if any subset of the connections form an odd loop.

16. The apparatus of claim 15, wherein the multi-patterning process uses only two photomasks to pattern the DPT-layer, and the second storage portion contains data representing respective identifications of three or more subsets of the plurality of polygons, wherein the polygons within each subset are to be formed in the DPT-layer using the same photomask as each other polygon in the same subset.

17. The apparatus of claim 15, wherein
the processor is configured so that the graph includes each subset of the plurality of polygons and any of the plurality of polygons that are:
intervening between two of the polygons within the same one of the subsets, and
positioned within a threshold distance of each other, and each subset of the plurality of polygons is represented in the graph by a single node.

18. The apparatus of claim 15, wherein:
the layout includes a cell from a cell library, the cell having a predetermined configuration of polygons, and the subset of the plurality of polygons includes all of the polygons in the at least one cell.

19. The apparatus of claim 18 wherein:
at least two instantiations of the cell are included in the layout, and
each instantiation of the cell located within a second threshold distance of another instantiation of the cell is to be formed in the DPT-layer using the same photomask as each other.

20. The apparatus of claim 15, further comprising:
a second storage portion of the at least one persistent, machine-readable storage medium storing at least one identification of first and second additional subsets of the plurality of polygons that are to be formed in the DPT-layer, such that none of the second additional subset of polygons are to be formed using the same photomask as any of the first additional subset of polygons;
wherein the processor is configured to include in the graph a respective additional connection between each individual polygon of the first additional subset and each individual polygon of the second additional subset.

21. The apparatus of claim 20, wherein:
at least one polygon of the subset of the plurality of polygons is to be formed using the same photomask as is to be used to form at least one of the first and second additional subsets of polygons.

22. The apparatus of claim 15, wherein:
the multi-patterning process uses only two photomasks to pattern the DPT-layer, and the second storage portion includes data representing respective identifications of first and second subsets of the plurality of polygons, the first subset of polygons having a higher priority than the second subset, and
the processor is configured to differentiate multi-patterning conflicts among the first set of polygons from multi-patterning conflict among the second set of polygons.

* * * * *

UNITED STATES PATENT AND TRADEMARK OFFICE
CERTIFICATE OF CORRECTION

PATENT NO. : 8,468,470 B2  
APPLICATION NO. : 13/238127  
DATED : June 18, 2013  
INVENTOR(S) : Chin-Chang Hsu et al.

Page 1 of 1

It is certified that error appears in the above-identified patent and that said Letters Patent is hereby corrected as shown below:

IN THE CLAIMS:

Claim 12, Column 14, Line 35, delete "ion" and insert -- in --.

Signed and Sealed this
Twenty-fourth Day of December, 2013

Margaret A. Focarino
*Commissioner for Patents of the United States Patent and Trademark Office*